United States Patent
Vampola et al.

(10) Patent No.: US 8,294,232 B2
(45) Date of Patent: Oct. 23, 2012

(54) HIGH QUANTUM EFFICIENCY OPTICAL DETECTORS

(75) Inventors: John L. Vampola, Santa Barbara, CA (US); Sean P. Kilcoyne, Lompoc, CA (US); Robert E. Mills, Goleta, CA (US); Kenton T. Veeder, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 409 days.

(21) Appl. No.: 12/611,388

(22) Filed: Nov. 3, 2009

(65) Prior Publication Data

US 2011/0147878 A1    Jun. 23, 2011

Related U.S. Application Data

(60) Provisional application No. 61/145,041, filed on Jan. 15, 2009.

(51) Int. Cl.
*H01L 29/868* (2006.01)
*H01L 29/06* (2006.01)

(52) U.S. Cl. ........ 257/458; 257/233; 257/291; 257/292; 257/463; 257/E21.503; 257/E21.511; 257/E21.551; 257/E27.132; 257/E27.133; 438/48; 438/57; 438/97; 438/328

(58) Field of Classification Search .......... 257/233, 257/291, 292, 458, 463, E21.503, E21.511, 257/E21.551, E27.132, E27.133; 438/48, 438/57, 97, 328

See application file for complete search history.

(56) References Cited

U.S. PATENT DOCUMENTS

| 6,184,100 | B1 * | 2/2001 | Arai | 438/328 |
|---|---|---|---|---|
| 6,765,246 | B2 * | 7/2004 | Inagaki | 257/223 |
| 7,259,412 | B2 * | 8/2007 | Yamaguchi et al. | 257/291 |
| 7,535,074 | B2 * | 5/2009 | Einbrodt et al. | 257/458 |
| 7,732,886 | B2 * | 6/2010 | Shih et al. | 257/458 |
| 7,737,475 | B2 * | 6/2010 | Hynecek | 257/222 |
| 2003/0209652 | A1 | 11/2003 | Fujii et al. | |
| 2005/0221541 | A1 | 10/2005 | Metzler et al. | |

OTHER PUBLICATIONS

PCT, "Notification of Transmittal of the International Search Report and the Written Opinion of the International Searching Authority, or the Declaration," Application No. PCT/US2010/021136, Mailed Apr. 9, 2010, 12 pages.

* cited by examiner

*Primary Examiner* — Dao H Nguyen
(74) *Attorney, Agent, or Firm* — Lando & Anastasi, LLP

(57) ABSTRACT

An optical detector includes a detector surface operable to receive light, a depleted field region coupled to the underside of the detector surface, a charge collection node underlying the depleted field region, an active pixel area that includes the portion of the depleted field region above the charge collection node and below the detector surface, and two or more guard regions coupled to the underside of the detector surface and outside of the active pixel area. The depleted field region includes an intrinsic or a near-intrinsic material. The charge collection node has a first width, and the guard regions are separated by a second width that is greater than the first width of the charge collection node. The guard regions are operable to prevent crosstalk to an adjacent optical detector.

20 Claims, 2 Drawing Sheets

HIGH QUANTUM EFFICIENCY OPTICAL DETECTORS

CROSS-REFERENCE TO RELATED APPLICATION

This application claims the benefit of priority under 35 U.S.C. §119(e) of U.S. Provisional Application Ser. No. 61/145,041, entitled "High Quantum Efficiency Optical Detectors", filed Jan. 15, 2009.

TECHNICAL FIELD

This disclosure relates in general to detectors and more particularly to a high quantum efficiency optical detector.

BACKGROUND

Optical devices are used in a variety of electronics applications. One example of an optical device is a photodiode which detects visible and/or non-visible light and converts it to another signal type, such as a current or a voltage. Some photodiodes may be partially comprised of silicon, germanium, or other semiconductor material that has been doped with impurities to alter its electrical properties. However, some photodiodes created in this manner may exhibit poor quantum efficiency in certain spectral regions.

SUMMARY OF THE DISCLOSURE

In accordance with one embodiment of the present disclosure, an optical detector includes a detector surface operable to receive light, a depleted field region coupled to the underside of the detector surface, a charge collection node underlying the depleted field region, an active pixel area that includes the portion of the depleted field region above the charge collection node and below the detector surface, and two or more guard regions coupled to the underside of the detector surface and outside of the active pixel area. The depleted field region includes an intrinsic or a near-intrinsic material. The charge collection node has a first width, and the guard regions are separated by a second width that is greater than the first width of the charge collection node. The guard regions are operable to prevent crosstalk to an adjacent optical detector.

Numerous technical advantages are provided according to various embodiments of the present disclosure. Particular embodiments of the disclosure may exhibit none, some, or all of the following advantages depending on the implementation. In certain embodiments, an improved short wavelength response of the device can be achieved. In certain embodiments, an improved short wavelength response can be achieved without substantially reducing longer wavelength response. Various embodiments may also reduce crosstalk between adjacent devices.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DRAWINGS

Figure 1A:
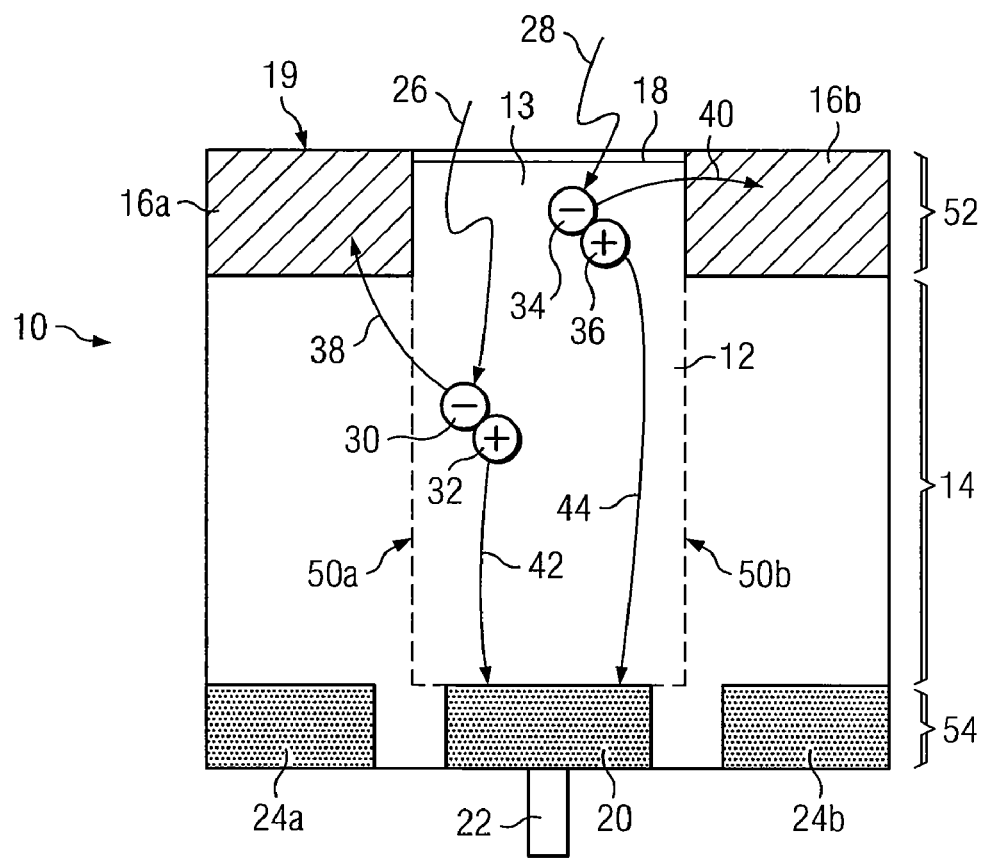
FIGS. 1A and 1B are block diagrams illustrating an optical detector with improved quantum efficiency in accordance with a particular embodiment of this disclosure.
Figure 1B:
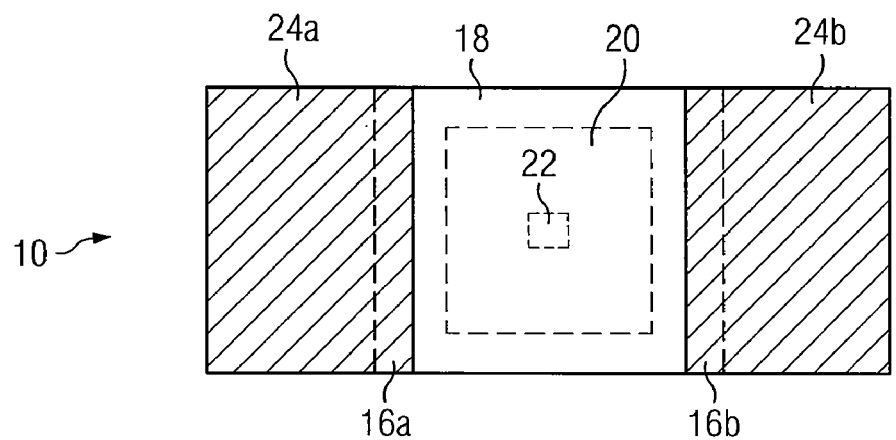
Figure 2:
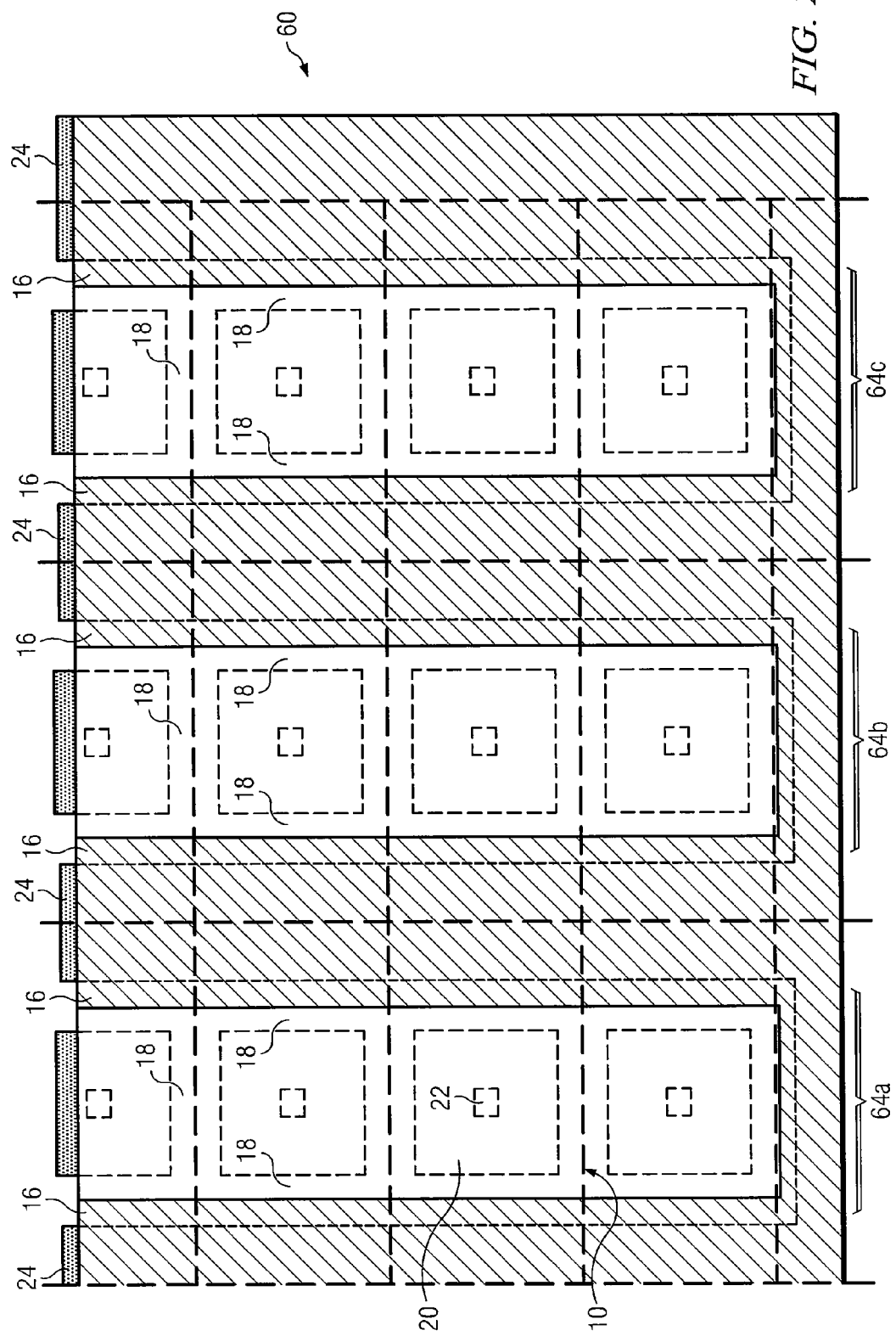
FIG. 2 is a block diagram illustrating an array of optical detectors with improved quantum efficiency in accordance with a particular embodiment of this disclosure.

Embodiments of the present disclosure and its advantages are best understood by referring to FIGS. 1A through 2 of the drawings, like numerals being used for like and corresponding parts of the various drawings.

Various detectors may be used to detect visible and/or non-visible light, or radiation, for a variety of purposes. Examples of these detectors include silicon or germanium PIN detectors, silicon or germanium NIP detectors, silicon PN detectors, charge-coupled devices (CCDs), and complementary metal-oxide-semiconductor (CMOS) detectors. Many typical detectors have a reduced response (i.e., a reduced quantum efficiency) in short wavelength regions (such as blue and ultraviolet (UV) light for silicon) due to device physics and structure. Other devices that have been optimized to provide an improved response in the blue and UV regions suffer from significant crosstalk to nearby detectors.

The teachings of certain embodiments of the disclosure recognize that it would be desirable to provide optical detectors with high quantum efficiency in the blue and UV regions without significantly introducing crosstalk to adjacent optical detectors. FIGS. 1A through 2 below illustrate an optical detector that may be manufactured with a lightly-doped or non-doped region underlying a backside electrode, along with one or more higher-doped guard regions adjacent to the lightly-doped or non-doped region underlying the backside electrode, to provide an improved response in the blue and UV regions without introducing significant crosstalk to nearby optical detectors.

FIGS. 1A and 1B illustrate various views of an example embodiment of an optical detector 10 with improved quantum efficiency. FIG. 1A illustrates a side view of optical detector 10, and FIG. 1B illustrates a top view of optical detector 10. In the illustrated embodiment, optical detector 10 includes a detector surface 19, an active pixel area 12, a depleted field region 14, an N+ backside contact region 52, and a P+ implant region 54. N+ backside contact region 52 includes N-guard regions 16a and 16b, a doping region 18, and an upper active pixel area 13. P+ implant region 54 includes a P-electrode 22, P-guard regions 24a and 24b, and a charge collection node 20, also referred to as a pixel.

Optical detector 10 may be any type of suitable light detection device, including, but not limited to, a PIN, a PN, an NIP, or an NP diode. Optical detector 10 may be constructed of silicon, Gallium Arsenide (GaAs), or any other suitable material. In the illustrated embodiment, optical detector 10 is a PIN diode that includes P+ implant region 54, N+ backside contact region 52 under detector surface 19 and at the opposite end of optical detector 10 from P+ implant region 54, and an intrinsic (or near-intrinsic) material in depleted field region 14 between P+ implant region 54 and N+ backside contact region 52.

P+ implant region 54 includes P-guard regions 24a and 24b, and a charge collection node 20. P-guard regions 24a and 24b and a charge collection node 20 may be any material that has been doped with any suitable P-type doping. Charge collection node 20 collects resulting holes from photons that have entered active pixel area 12 through doping region 18 and generates a charge on a P-electrode 22, which is coupled to charge collection node 20. P-guard regions 24a and 24b may be used to bias optical detector 10 and to create an electric field, as discussed in more detail below. In particular embodiments, P-guard regions 24a and 24b may not be necessary and therefore may not be implemented.

N+ backside contact region 52 includes detector surface 19, N-guard regions 16a and 16b, doping region 18, and upper active pixel area 13. Upper active pixel area 13 may be any suitable intrinsic (or near-intrinsic) material, such as that utilized in depleted field region 14. N-guard regions 16a and 16b may be any material that has been doped with any suitable N-type doping. N-guard regions 16a and 16b may be used to collect carriers and prevent crosstalk that may be caused by carriers traveling from one diode to an adjacent diode, as discussed in more detail below. In particular embodiments, N-guard regions 16a and 16b may not be necessary and therefore may not be implemented. In certain embodiments, N-guard regions 16a and 16b may be located adjacent to N-electrode 19 and active pixel area 12.

Optical detector 10 includes depleted field region 14 which lies above charge collection node 20. Depleted field region 14 may be any suitable intrinsic (or near-intrinsic) material. In embodiments where doping region 18 has a zero doping concentration, depleted field region extends from charge collection node 20 to detector surface 19 and encompasses upper active pixel area 13. In other embodiments where doping region 18 has a doping concentration greater than zero, depleted field region 14 extends from charge collection node 20 to doping region 18.

Depleted field region 14 includes active pixel area 12. Active pixel area 12 lies between detector surface 19 and charge collection node 20, and between dashed lines 50a and 50b. In particular embodiments, active pixel area 12 may be other shapes or sizes not specifically shown in the illustrated embodiment.

Typical optical detectors have regions of high doping that photons must travel through before reaching a detector. For example, the entire N+ backside contact region 52 of optical detector 10 (including upper active pixel area 13) would be highly doped with an N-type doping in a typical optical detector. This results in low quantum efficiency in the blue and UV regions since blue and UV light generate hole-electron pairs very near the entrance surface of silicon (i.e., near detector surface 19). Optical detector 10, however, includes upper active pixel area 13, which is a depleted field region, and doping region 18 underlying detector surface 19. This allows optical detector 10 to provide a high quantum efficiency in the blue and UV regions, as explained in more detail below.

Doping region 18 is a region of optical detector 10 coupled to the underside of detector surface 19. In certain embodiments, doping region 18 may be a region of relatively light doping (i.e., a lighter doping concentration than N-guard regions 16a and 16b). For example, in some embodiments in which optical detector 10 is constructed of silicon, doping region 18 may have a light doping concentration of approximately $10^{12}$ atoms/cm$^3$. In other embodiments, doping region 18 may not be doped at all. In some embodiments, doping region 18 may be a very thin layer of normal doping (i.e., a similar doping concentration to N-guard regions 16a and 16b). In such an embodiment, N-guard regions 16a and 16b may have a thickness that is substantially greater than the thickness of doping region 18. In some embodiments, doping region 18 has a width that is greater than the width of charge collection node 20.

In operation, light of one or more wavelengths enters optical detector 10 via detector surface 19, which in some embodiments may comprise a common electrode for multiple detector pixels. In FIG. 1, photon 26 represents a photon of a relatively longer wavelength, such as 700-900 nanometers. Photon 28 represents a photon of a shorter wavelength in the blue and UV regions, such as 300-500 nanometers. Photons of longer wavelength, such as photon 26, tend to penetrate deeper into active pixel area 12 and past N+ backside contact region 52 before they are absorbed and create a hole-electron pair. Photon 26 has created carriers represented by electron 30 and hole 32 in this example. Photons of shorter wavelength, such as photon 28, are absorbed closer to the surface of active pixel area 12, nearer to detector surface 19. Photon 28 has created electron 34 and hole 36 in this example.

Holes and electrons created by photons entering optical detector 10 may then either recombine (and go undetected) or be swept to a detector or guard region in optical detector 10. In the example illustrated in FIG. 1, electrons 30 and 34 may travel to guard regions 16a and 16b, respectively, along paths 38 and 40, respectively. Holes 32 and 36 may travel to charge collection node 20 along paths 42 and 44, respectively, where they can be detected by optical detector 10. The detection of the holes by charge collection node 20 may then be used for any suitable purpose.

In typical optical detectors, the area where shorter wavelength photons create hole-electron pairs is highly doped. In the illustrated embodiment, for example, this would correspond to upper active pixel area 13 and doping region 18. A highly doped region has a reduced field and may additionally have damage due to implanting, annealing, and other processing. In a highly doped and/or damaged area, carriers may experience short diffusion lengths and short lifetimes for electron-hole pairs. Hole-electron pairs generated in a highly doped and/or damaged region, such as those generated from blue and UV light for silicon detectors, may have a higher probability of recombining than pairs generated in an active area outside of the damaged region. As a result, they may not be attracted to opposite electrodes, and may ultimately go undetected. This reduces the quantum efficiency of the device in the short wavelength spectral regions (e.g., blue and UV light).

Optical detector 10, however, provides improved quantum efficiency in the short wavelength spectral regions by including a lower, or zero doping level in doping region 18, and an upper active pixel area 13 that is a depleted field region. These regions underlie detector surface 19, as illustrated in optical detector 10 in FIG. 1. These regions provide an improved short wavelength response for optical detector 10 by reducing the size of the damaged area near detector surface 19, and also providing a field in this region to direct carriers to N-guard regions 16 or charge collection node 20 for detection.

In typical detectors, simply reducing or eliminating the doping of the entrance surface of the detector will result in poor conduction of the charge to the power supply and thus will introduce significant crosstalk to adjacent detectors. Optical detector 10, however, includes guard regions 16a, 16b, 24a, and 24b that maintain the bias on optical detector 10 and prevent crosstalk to adjacent detectors. N-guard regions 16a and 16b are adjacent to upper active pixel area 13 and doping region 18 (and underlying detector surface 19) and may be any material that has been doped with any suitable N-type doping to a concentration that is comparatively higher than upper active pixel area 13. Similarly, P-guard regions 24a and 24b may be any material that has been doped with any suitable P-type doping to a concentration that is comparatively higher than depleted field region 14.

In operation, guard regions 16 and 24 may be used to bias optical detector 10 and to create an electric field in depleted field region 14 and upper active pixel area 13. The electric field in these regions may help guide holes and electrons to the detectors. In addition, in some embodiments guard regions 16 and 24 may be used to collect carriers and prevent crosstalk that may be caused by carriers traveling from one optical detector to an adjacent optical detector. This can also help delineate one optical detector from another. In some embodiments, guard regions 16 and 24 may not be necessary and therefore may not be implemented.

Although this particular example has assumed the use of N-type doping in regions 16a and 16b, P-type doping in regions 20, 24a, and 24b, and intrinsic or near-intrinsic doping in active pixel area 12 and upper active pixel area 13, the dopants could be reversed in those regions consistent with this discussion. Examples of N-type dopants include arsenic and phosphorus, among others. Examples of P-type dopants include boron, among others.

In some embodiments, the width of charge collection node 20 may be selectively controlled to be less than the width of active pixel area 12 between N-guard regions 16a and 16b. This can provide flexibility in fabrication. For example, the width of charge collection node 20 may allow for tolerances when aligning masks for front and/or backside fabrication steps.

FIG. 2 illustrates an example embodiment of an array 60 of multiple optical detectors 10. In this embodiment, parts of twelve optical detectors 10 are illustrated in three columns: columns 64a-64c. In other embodiments, array 60 may include any number of optical detectors 10 in any number of columns 64. In some embodiments, array 60 may be a focal plane array that includes a detector array of optical detectors 10 and a read-out integrated circuit array (not illustrated in FIG. 2).

Columns 64a-64c of array 60 may each correspond to a specific color. For example, column 64a may correspond to the color blue and thus may include a corresponding filter (not shown). Columns 64b and 64c may correspond to other colors such as red and green and may also include corresponding filters (not shown).

Each optical detector 10 in array 60 may includes guard regions 16a, 16b, 24a, and 24b, as previously described in reference to FIG. 1. Guard regions 16 and may help prevent crosstalk between adjacent optical detectors 10 in array 60 and help delineate between optical detectors 10 as previously described.

Although the embodiments in the disclosure have been described in detail, numerous changes, substitutions, variations, alterations, and modifications may be ascertained by those skilled in the art. For example, optical detector 10 has been described and depicted as a PIN diode. In other embodiments, however, optical detector 10 may be other suitable devices such as a PN, an NIP, or an NP diode. In addition, while dopants arsenic, phosphorus, and boron have been described, any other suitable dopant may be utilized. It is intended that the present disclosure encompass all such changes, substitutions, variations, alterations, and modifications as falling within the spirit and scope of the appended claims.

What is claimed is:

1. An optical detector, comprising:
   a detector surface operable to receive light;
   a doping region coupled to the underside of the detector surface, the doping region comprising a first material having a first doping concentration, the doping region having a first width;
   a depleted field region underlying the doping region, the depleted field region comprising an intrinsic or a near-intrinsic material, the depleted field region operable to support the generation of a hole and an electron from the received light;
   a charge collection node underlying the depleted field region, the charge collection node having a second width that is less than the first width of the doping region, the charge collection node operable to collect either the hole or the electron generated from the received light;
   an electrode coupled to the charge collection node; and
   two or more guard regions coupled to the underside of the detector surface and adjacent to the doping region, the guard regions comprising a second material having a second doping concentration, the guard regions operable to collect either the hole or the electron generated from the received light and to prevent crosstalk to an adjacent optical detector;
   wherein the second doping concentration of the guard regions is substantially higher than the first doping concentration of the doping region.

2. The optical detector of claim 1, wherein the doping region comprises a first thickness, and the guard regions comprise a second thickness that is substantially greater than the first thickness.

3. The optical detector of claim 1, wherein the first doping concentration of the first material is zero.

4. The optical detector of claim 1, wherein the second material comprises a material that has been doped with N-type doping.

5. The optical detector of claim 1, wherein the second material comprises a material that has been doped with P-type doping.

6. The optical detector of claim 1, wherein the second material comprises a material that has been doped with arsenic.

7. The device of claim 1, further comprising two or more collector guard regions underlying the depleted field region and adjacent to the charge collection node.

8. The device of claim 7, wherein two or more collector guard regions comprise a material that has been doped with boron.

9. An optical detector, comprising:
   a detector surface operable to receive light;
   a depleted field region coupled to the underside of the detector surface, the depleted field region comprising an intrinsic or a near-intrinsic material;
   a charge collection node underlying the depleted field region, the charge collection node having a first width;
   an active pixel area comprising the portion of the depleted field region above the charge collection node and below the detector surface; and
   two or more guard regions coupled to the underside of the detector surface and outside of the active pixel area, the guard regions separated by a second width that is greater than the first width of the charge collection node, the guard regions operable to prevent crosstalk to an adjacent optical detector.

10. The optical detector of claim 9, wherein the two or more guard regions comprise a material that has been doped with N-type doping.

11. The optical detector of claim 9, wherein the two or more guard regions comprise a material that has been doped with P-type doping.

12. The optical detector of claim 9, wherein the two or more guard regions comprise a material that has been doped with arsenic.

13. The device of claim 9, further comprising two or more collector guard regions underlying the depleted field region, adjacent to the charge collection node, and outside the active pixel area.

14. The device of claim 13, wherein the two or more collector guard regions comprise a material that has been doped with boron.

15. A method of providing an optical detector, comprising:
  providing a detector surface operable to receive light;
  providing a depleted field region coupled to the underside of the detector surface, the depleted field region comprising an intrinsic or a near-intrinsic material;
  providing a charge collection node underlying the depleted field region, the charge collection node having a first width;
  providing an active pixel area comprising the portion of the depleted field region above the charge collection node and below the detector surface; and
  providing two or more guard regions coupled to the underside of the detector surface and outside of the active pixel area, the guard regions separated by a second width that is greater than the first width of the charge collection node, the guard regions operable to prevent crosstalk to an adjacent optical detector.

16. The method of claim 15, wherein the two or more guard regions comprise a material that has been doped with N-type doping.

17. The method of claim 15, wherein the two or more guard regions comprise a material that has been doped with P-type doping.

18. The method of claim 15, wherein the two or more guard regions comprise a material that has been doped with arsenic.

19. The device of claim 15, further comprising two or more collector guard regions underlying the depleted field region, adjacent to the charge collection node, and outside the active pixel area.

20. The device of claim 19, wherein the two or more collector guard regions comprise a material that has been doped with boron.

\* \* \* \* \*